(12) United States Patent
Wu et al.

(10) Patent No.: US 8,008,137 B2
(45) Date of Patent: Aug. 30, 2011

(54) METHOD FOR FABRICATING 1T-DRAM ON BULK SILICON

(75) Inventors: Albert Wu, Palo Alto, CA (US); Roawen Chen, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 400 days.

(21) Appl. No.: 11/674,008

(22) Filed: Feb. 12, 2007

(65) Prior Publication Data

US 2007/0215906 A1 Sep. 20, 2007

Related U.S. Application Data

(60) Provisional application No. 60/782,479, filed on Mar. 15, 2006.

(51) Int. Cl.
*H01L 21/84* (2006.01)

(52) U.S. Cl. ........ 438/152; 438/149; 438/153; 438/154; 438/155; 257/68; 257/69; 257/70; 257/204; 257/347; 257/353; 257/401; 257/E27.112

(58) Field of Classification Search ................ 257/202, 257/204, 68–70, 296–313, 347, 353, 401, 257/E27.112; 438/239–256, 199–233, 149, 438/152
See application file for complete search history.

(56) References Cited

U.S. PATENT DOCUMENTS

| | | | | |
|---|---|---|---|---|
| 6,022,766 A | * | 2/2000 | Chen et al. | 438/152 |
| 6,844,243 B1 | | 1/2005 | Gonzalez | |
| 2002/0005519 A1 | * | 1/2002 | Muramatsu et al. | 257/70 |
| 2004/0032764 A1 | * | 2/2004 | Koga et al. | 365/189.05 |
| 2004/0080999 A1 | | 4/2004 | Madurawe | |
| 2004/0214379 A1 | * | 10/2004 | Lee et al. | 438/149 |
| 2004/0246765 A1 | | 12/2004 | Kato | |
| 2005/0280156 A1 | * | 12/2005 | Lee | 257/758 |
| 2006/0049444 A1 | | 3/2006 | Shino | |
| 2007/0007532 A1 | * | 1/2007 | Kang et al. | 257/67 |

FOREIGN PATENT DOCUMENTS

WO  WO 2004/015764  2/2004

OTHER PUBLICATIONS

P. C. Fazan, S. Okhonin, M. Nagoga, J. Sallese; A simple 1-transistor capacitor-less memory cell for high performance embedded drams: IEEE 2002 Cusom integrated circuits conference: pp. 99-102.*
H. Wann, C. Hu; A capacitorless dram cell on soi substrate: Electron Devices Meeting, 1993. Technical Digest., International: pp. 26.4.1-26.4.4.*
P.C. Fazan et al. A simple 1-transistor capacitor-less memory cell for high peroformance embedded drams: IEEE 2002 Custom integrated circuits conference: pp. 99-102.*

(Continued)

*Primary Examiner* — N Drew Richards
*Assistant Examiner* — John P Dulka

(57) ABSTRACT

An integrated circuit includes a bulk technology integrated circuit (bulk IC) including a bulk silicon layer and complementary MOSFET (CMOS) transistors fabricated thereon. The integrated circuit also includes a single transistor dynamic random access memory (1T DRAM) cell arranged adjacent to and integrated with the bulk IC.

11 Claims, 8 Drawing Sheets

OTHER PUBLICATIONS

H. Wann et al; A capacitorless dram cell on soi substrate: Electron Devices Meeting, 1993 Technical Digest., International: pp. 26.4.1-26.4.4.*

P.C. Fazan et al. A simple 1-transistor capacitor-less memory cell for high performance embedded drams: IEEE 2002 Custom integrated circuits conference: p. 99-102.*

Okhonin, S. et al, "A Capacitor-Less 1T-DRAM Cell," IEEE Electron Device Letters, vol. 23, No. 2, Feb. 2002; pp. 85-87.

Communication from the European Patent Office dated Jun. 15, 2010 with the Extended European Search Report regarding Application No. 07005406.9-2203.

* cited by examiner

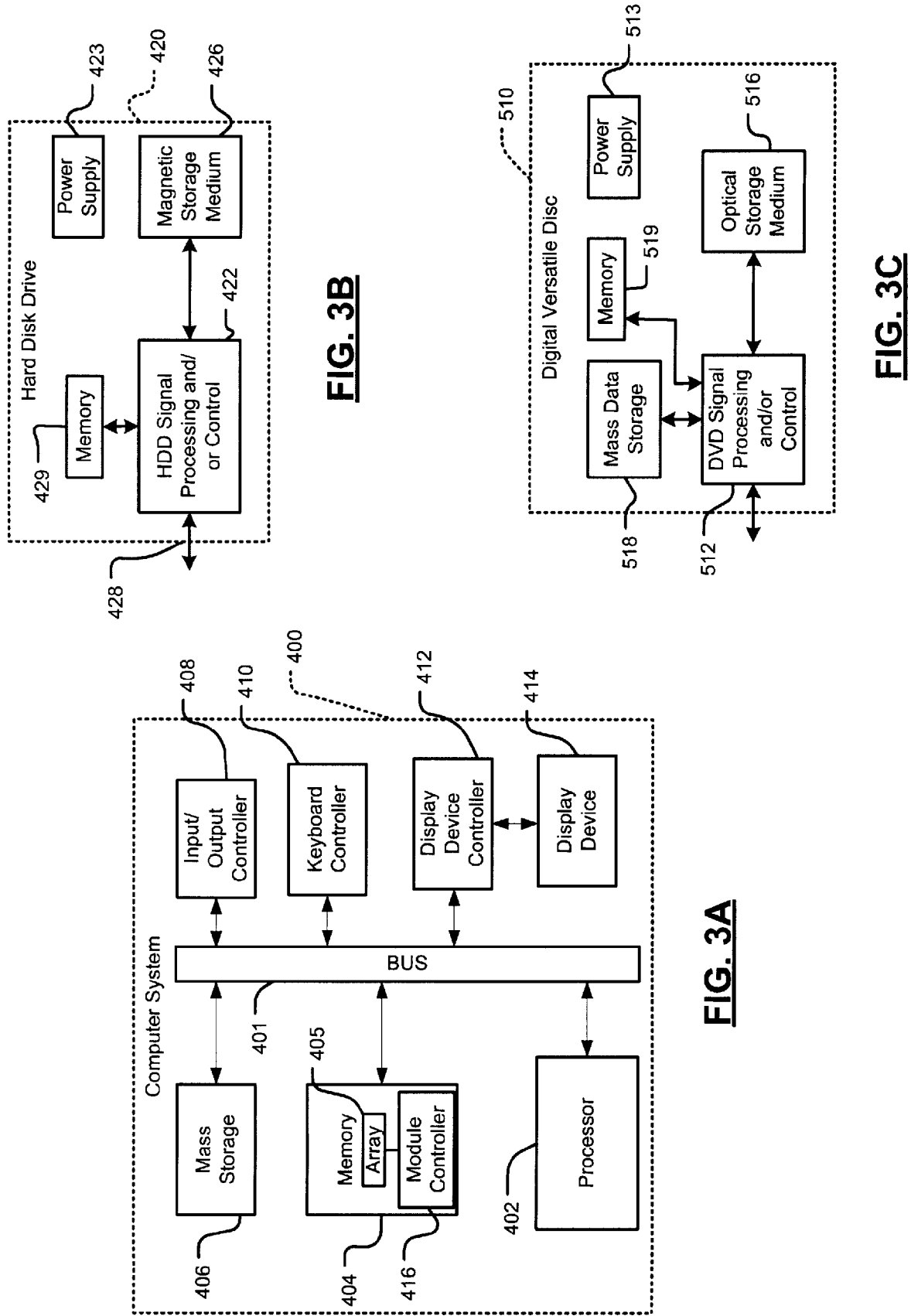

METHOD FOR FABRICATING 1T-DRAM ON BULK SILICON

CROSS-REFERENCE TO RELATED APPLICATIONS

This application claims the benefit of U.S. Provisional Application No. 60/782,479, filed on Mar. 15, 2006. The disclosure of the above application is incorporated herein by reference in its entirety.

FIELD

The present disclosure relates to memory arrays and, more particularly, to memory arrays fabricated on bulk silicon.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Memory cells of some dynamic random access memories (DRAMs) include a field-effect transistor (FET) and a capacitor. The capacitor stores binary 1's and 0's as charged or discharged states. The capacitor is controlled by switching of the corresponding FET, which also controls reading of the data stored in the memory cell.

Demand for increased memory storage capacity has led to a substantial increase in cell density. As cell density increased, cell capacitance was decreased to maintain isolation between adjacent cells in the memory array. However, reducing cell capacitance also reduces the output of the memory cells, which makes reading more difficult.

One transistor (1T) capacitor-less DRAM cells have further reduced cell size. 1T DRAM cells use a transistor body for charge storage such that a memory state can be read through a bit line biasing a drain current. Therefore, 1T DRAM cells do not need a capacitor in each cell and density can be increased. 1T DRAM technology, however, requires silicon on insulator (SOI) wafers, which are expensive, in short supply, and incompatible with traditional bulk silicon complementary metal-oxide semiconductor (CMOS) devices.

SUMMARY

An integrated circuit comprises a bulk technology integrated circuit (bulk IC) including a bulk silicon layer and complementary MOSFET (CMOS) transistors fabricated thereon. The integrated circuit also comprises a first single transistor dynamic random access memory (1T DRAM) cell arranged adjacent to and integrated with the bulk IC. The first 1T DRAM cell includes an amorphous silicon layer and first and second gates including first and second gate oxide layers arranged adjacent to the amorphous silicon layer. The first and second gates also include first and second gate polysilicon layers arranged in the first and second gate oxide layers.

In other features, the first 1T DRAM cell includes a first inter-layer dielectric (ILD) arranged adjacent to the amorphous silicon layer and the first and second gates. The bulk silicon layer of the bulk IC includes an N well including first and second doped regions and a P well including third and fourth doped regions. The bulk IC further comprises third and fourth gates including third and fourth gate oxide layers arranged adjacent to the bulk silicon layer. The bulk IC still further comprises third and fourth gate polysilicon layers arranged in the third and fourth gate oxide layers.

In other features, the integrated circuit comprises a second ILD arranged adjacent to the bulk silicon layer and the third and fourth gates. First and second contacts are arranged in the second ILD that communicate with the first and fourth doped regions of the bulk silicon layer. Third and fourth contacts are arranged in the first ILD that communicate with the first and second contacts. A metal bit line communicates with the third and fourth contacts.

In other features, the amorphous silicon layer includes first, second and third doped regions. The first gate is arranged adjacent to parts of the first and second doped regions, and the second gate is arranged adjacent to parts of the second and third doped regions. A fifth contact is arranged in the first ILD that communicates with the second doped region of the amorphous silicon layer. A bit line communicates with the CMOS transistors and the first 1T DRAM cell. The first 1T DRAM cell comprises a first transistor that includes a gate region. The first transistor also comprises a body region and a source region. The body region stores data and comprises an amorphous silicon layer.

In other features, the integrated circuit comprises a second 1T DRAM cell including a second transistor that shares the source region with the transistor of the first 1T DRAM cell. The first 1T DRAM cell and the second 1T DRAM cell store two bits of data. The first 1T DRAM cell comprises a source region, a body region, and a drain region. The source region, the body region, and the drain region are formed in a doped amorphous silicon layer arranged adjacent to the bulk IC.

In other features, the source region of the first 1T DRAM cell comprises crystallized silicon that is seeded with nickel. The source region of the first 1T DRAM cell comprises a seeded crystallized silicon island. The crystallized silicon island and the bulk IC have a common orientation.

In other features, a method for fabricating an integrated circuit comprises fabricating complementary MOSFET (CMOS) transistors on a bulk technology integrated circuit (bulk IC) including a bulk silicon layer. The method also comprises arranging a first single transistor dynamic random access memory (1T DRAM) cell adjacent to and integrated with the bulk IC. The method further comprises arranging first and second gates including first and second gate oxide layers adjacent to an amorphous silicon layer of the first 1T DRAM cell. The method further comprises arranging first and second gate polysilicon layers in the first and second gate oxide layers.

In other features, the method comprises arranging a first inter-layer dielectric (ILD) of the first 1T DRAM cell adjacent to the amorphous silicon layer and the first and second gates. The method further comprises arranging third and fourth gates of the bulk IC including third and fourth gate oxide layers adjacent to the bulk silicon layer. The method still further comprises arranging third and fourth gate polysilicon layers in the third and fourth gate oxide layers. The bulk silicon layer of the bulk IC includes an N well including first and second doped regions and a P well including third and fourth doped regions.

In other features, the method comprises arranging a second ILD adjacent to the bulk silicon layer and the third and fourth gates. The method further comprises arranging first and second contacts in the second ILD that communicate with the first and fourth doped regions of the bulk silicon layer. The method further comprises arranging third and fourth contacts in the first ILD. The first and second contacts communicate with the third and fourth contacts. The method further comprises arranging a metal bit line to communicate with the third and fourth contacts. The method further comprises arranging the first gate adjacent to parts of first and second doped regions of the amorphous silicon layer. The method still further comprises arranging the second gate adjacent to parts of second and third doped regions of the amorphous silicon layer.

In other features, the method comprises arranging a fifth contact in the first ILD to communicate with the second doped region of the amorphous silicon layer. The method further comprises arranging a bit line to communicate with the CMOS transistors and the first 1T DRAM cell. The first 1T DRAM cell comprises a first transistor that includes a gate region. The first 1T DRAM cell comprises a first transistor comprising a body region and a source region.

In other features, the method comprises storing data in the body region. The body region comprises an amorphous silicon layer. The method further comprises sharing the source region of the transistor of the first 1T DRAM cell with a second transistor for a second 1T DRAM cell. The method further comprises storing two bits of data in the first 1T DRAM cell and the second 1T DRAM cell. The method further comprises forming a source region, a body region, and a drain region of the first 1T DRAM in a doped amorphous silicon layer. The method further comprises seeding crystallized silicon of the source region of the first 1T DRAM cell with nickel.

In other features, the method comprises seeding the source region of the first 1T DRAM cell. The method further comprises crystallizing a silicon island in the source region of the first 1T DRAM cell. The method further comprises arranging the crystallized silicon island and the bulk IC in a common orientation.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A is a functional block diagram of a laptop computer system;

FIG. 3B is a functional block diagram of a hard disk drive (HDD);

FIG. 3C is a functional block diagram of a digital versatile disk (DVD);

DETAILED DESCRIPTION

Figure 1A:
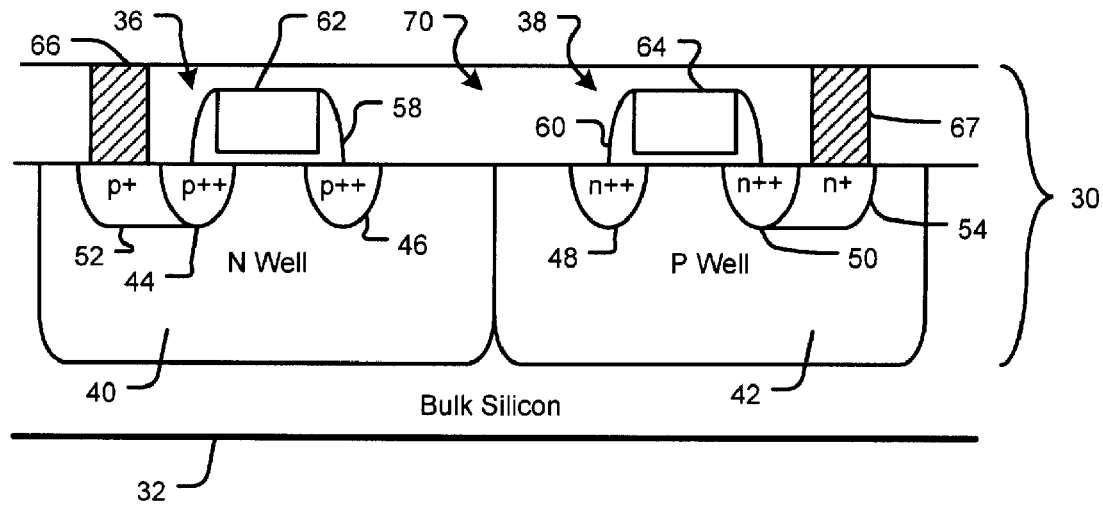
FIG. 1A is a cross-section of a bulk silicon CMOS IC.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. It should be understood that steps within a method may be executed in different order without altering the principles of the present disclosure.

In accordance with the present disclosure, a fabrication method for a memory array including one transistor capacitor-less dynamic random access memory (1T DRAM) cells arranged on a bulk silicon integrated circuit is described. Referring now to FIG. 1A, a bulk technology integrated circuit (bulk IC) 30 includes a bulk silicon layer 32. Semiconductor components, such as complementary metal-oxide semiconductor (CMOS) transistors 36, 38, are fabricated in the bulk IC 30 using any suitable method.

The bulk IC 30 may be fabricated using the following steps. N and p type wells 40 and 42 respectively, may be formed in the bulk silicon layer 32 using patterning and a diffusion process. The bulk silicon layer 32 may be heated at this time and/or later to anneal damage from the ion implantation and to drive the dopants sufficiently within the n and p type wells 40 and 42.

After the n and p wells 40 and 42 are formed in the bulk silicon layer 32, a series of patterning and implanting steps may be used to define hole dense (p++) regions 44 and 46, electron dense (n++) regions 48 and 50, and less dense regions (p+) 52 and (n+) 54. An ion implanter directs selected dopant ions on selectively exposed portions of the surface of the bulk silicon layer 32 during these steps to alter the doping of the exposed portions. Annealing may be performed before and/or after doping.

Once the bulk silicon layer 32 is doped, an oxide layer is grown on the bulk silicon layer 32. The oxide layer is patterned in selected areas to create first gate oxide portions 58, 60. A layer of polysilicon is deposited over the oxide layer and patterned to create gates 62 and 64 in selected areas. Ions may also be implanted in the polysilicon to lower gate resistance if needed. Contacts 66 and 67 may be patterned as well. The contacts 66, 67 are created above and communicate with the (p+) region 52 and the (n+) region 54, respectively. A first inter-layer dielectric (ILD) 70 is arranged over the exposed upper surface of the bulk IC 30.

Figure 1B:
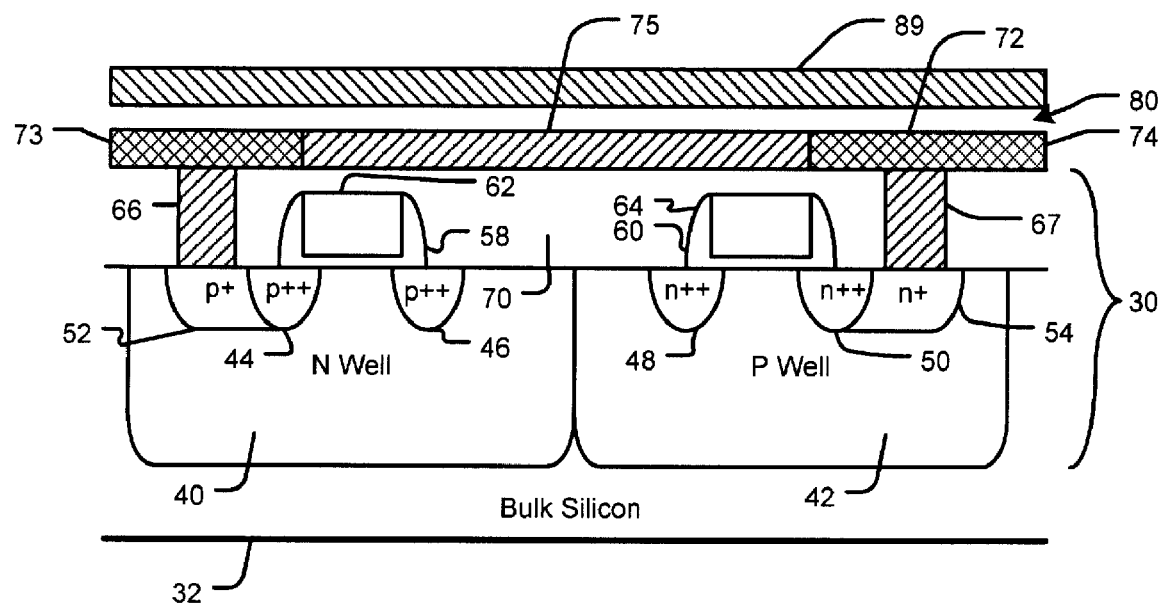
FIG. 1B is a partial cross-section of a 1T DRAM fabricated on a bulk silicon CMOS in accordance with the present disclosure.

Referring now to FIG. 1B, a thin layer of amorphous silicon ($\alpha$Si) 72 is deposited above the first ILD 70. Portions 73, 74 are removed from the $\alpha$Si 72 leaving a remainder 75. A gate oxide 80 or second polysilicon gate oxide is deposited above the remainder 75 of $\alpha$Si 72. The gate oxide 80 may be deposited at a low temperature (e.g. less than 400° C.) to maintain the αSi 72 in the amorphous state. Above the gate oxide 80 is deposited a second polysilicon layer 89.

Figure 1C:
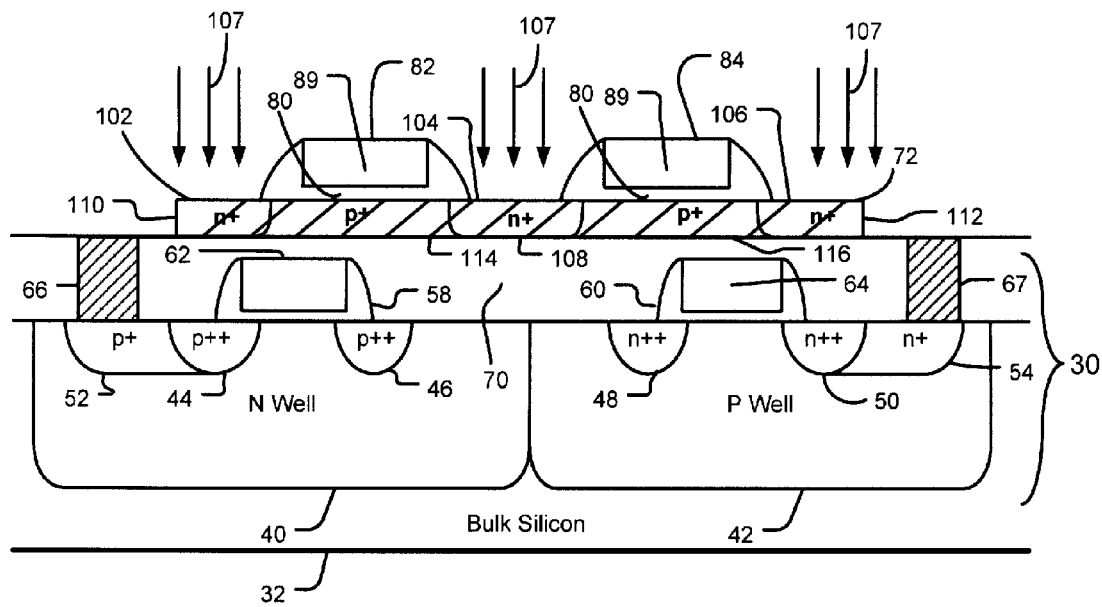
FIG. 1C is a partial cross-section of a 1T DRAM fabricated on a bulk silicon CMOS in accordance with the present disclosure.

Referring now to FIG. 1C, the polysilicon layer 89 and the gate oxide layer 80 are patterned to form gates 82, 84 including polysilicon isolated by gate oxide. Areas 102, 104, 106 defined adjacent to the gates 82, 84 are implanted or bombarded with ions 107 to introduce selected impurities or dopants. The areas 102, 104, 106, are illustrated becoming n+ doped regions 108, 110, 112. The region 108 becomes a source region shared by the gates 82, 84. The regions 110, 112 become drain regions separated from the source region 108 by p+ regions 114, 116 (i.e. the transistor body regions) of the αSi 72.

The ion implants can be either n+ or p+ depending on whether the desired thin film transistor (TFT) is a positive metal-oxide semiconductor field-effect transistor (PMOS) or a negative metal-oxide semiconductor field-effect transistor (NMOS) respectively.

Figure 1D:
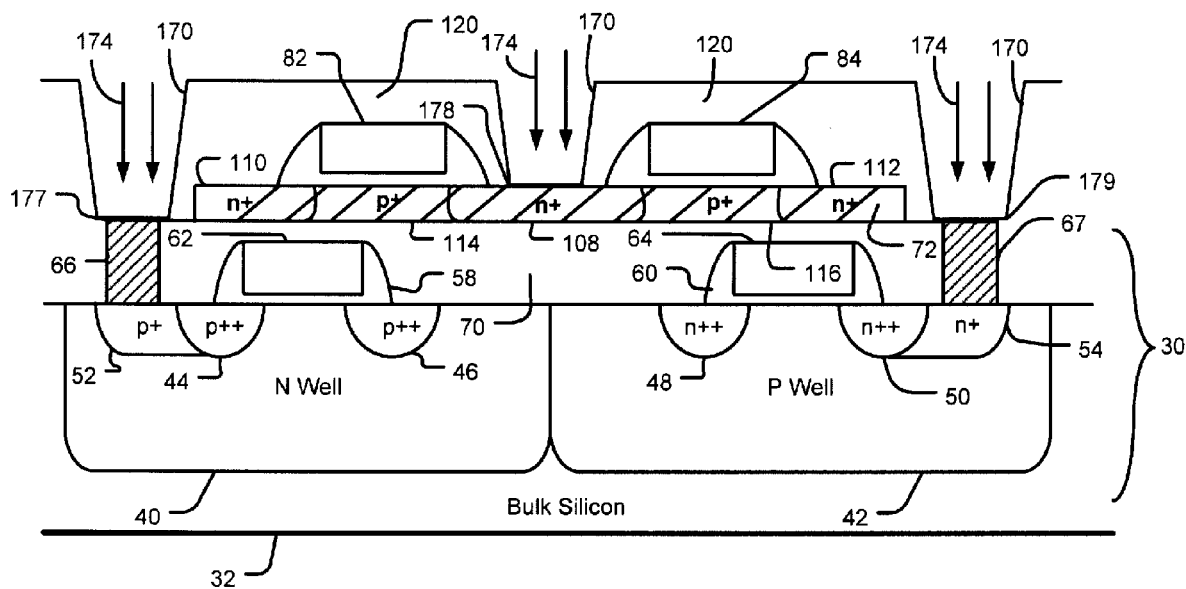
FIG. 1D is a partial cross-section of a 1T DRAM fabricated on a bulk silicon CMOS in accordance with the present disclosure.

Referring now to FIG. 1D, a second inter-layer dielectric 120 $ILD_{n+1}$ is deposited over the gates 82, 84, αSi 72, and contacts 66, 67. Holes 170 are opened or etched in the $ILD_{n+1}$ 120 to the top of the layer of n-type αSi 72 in the source region 108 and the top of the contacts 66, 67. Within the holes 170 are deposited seed materials 174 such as nickel (Ni). The materials 174 cause a low temperature solid-phase epitaxy on the αSi 72, forming crystalline layers 177, 178, 179 or islands. The crystal layers are grown on the αSi 72 in such a manner that their crystalline orientation is the same as that of the substrate of the αSi 72. The materials 174 may seed the top or the bottom of the n-type αSi 72. The solid-phase epitaxy converts the αSi 72 in the $ILD_{n+1}$ holes into crystalline silicon islands and activates the ions implanted in FIG. 1C.

Figure 1E:
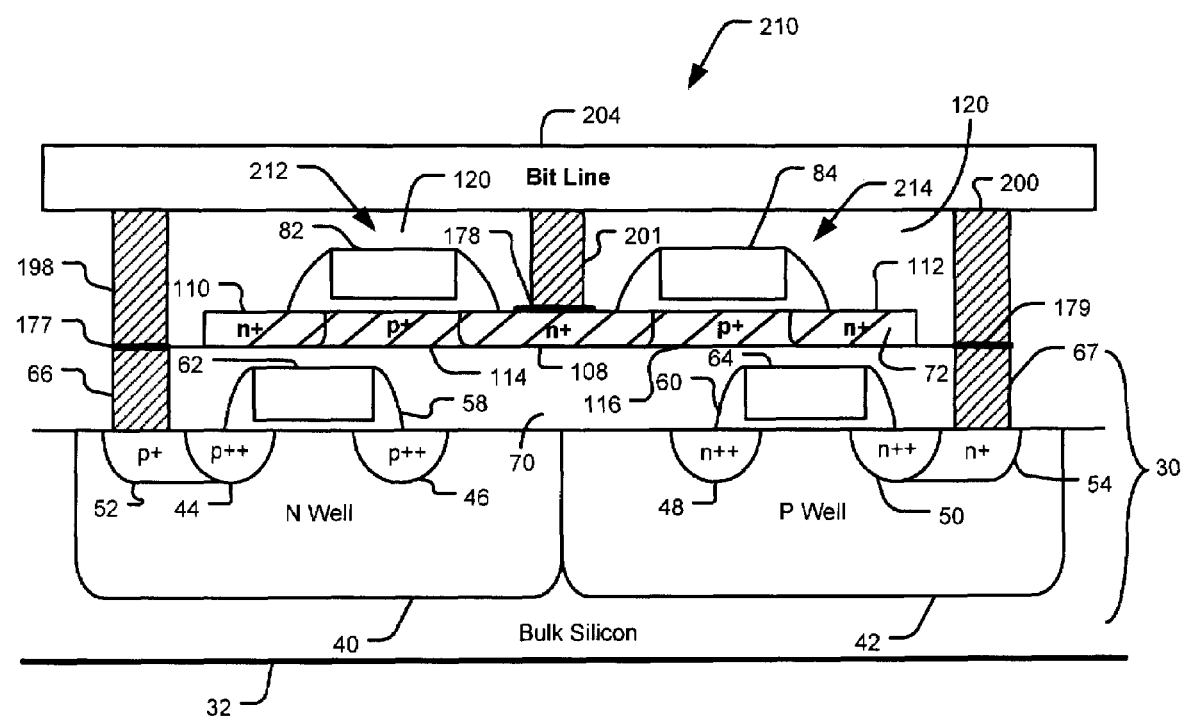
FIG. 1E is a partial cross-section of a 1T DRAM fabricated on a bulk silicon CMOS in accordance with the present disclosure.

Referring now to FIG. 1E, a second level of contacts 198, 200, 201, which may be referred to as first, second, and third contacts, fill the holes 170. The top of the contacts 198, 200, 201 and the top of $ILD_{n+1}$ 120 are smoothed or polished using, for example, chemical mechanical polishing (CMP). On the polished area, a first metal bit line 204 may be deposited. Remaining metal layers can then be added through traditional processes. In other words, the first metal bit line 204 or a metallization layer ($M_1$) is subsequently strapped thereon and patterned.

The bit line 204 is connected to the second level of contacts 198, 200, and 201 and therefore contacts the first level of contacts 66, 67 through the crystalline layers 177, 179 and the source region 108 through the crystalline layer 178. Thus, a memory system 210 or array is formed from thin film transistors 212, 214. The transistors can be first and second 1T DRAM transistors respectively. These transistors may store data in the p+ body regions 114, 116 of the thin film transistors 212, 214.

The steps described above from FIGS. 1B-1E may be repeated multiple times, to create a three dimensional (3D) memory "cube", or 3D array of memory cells.

Figure 2:
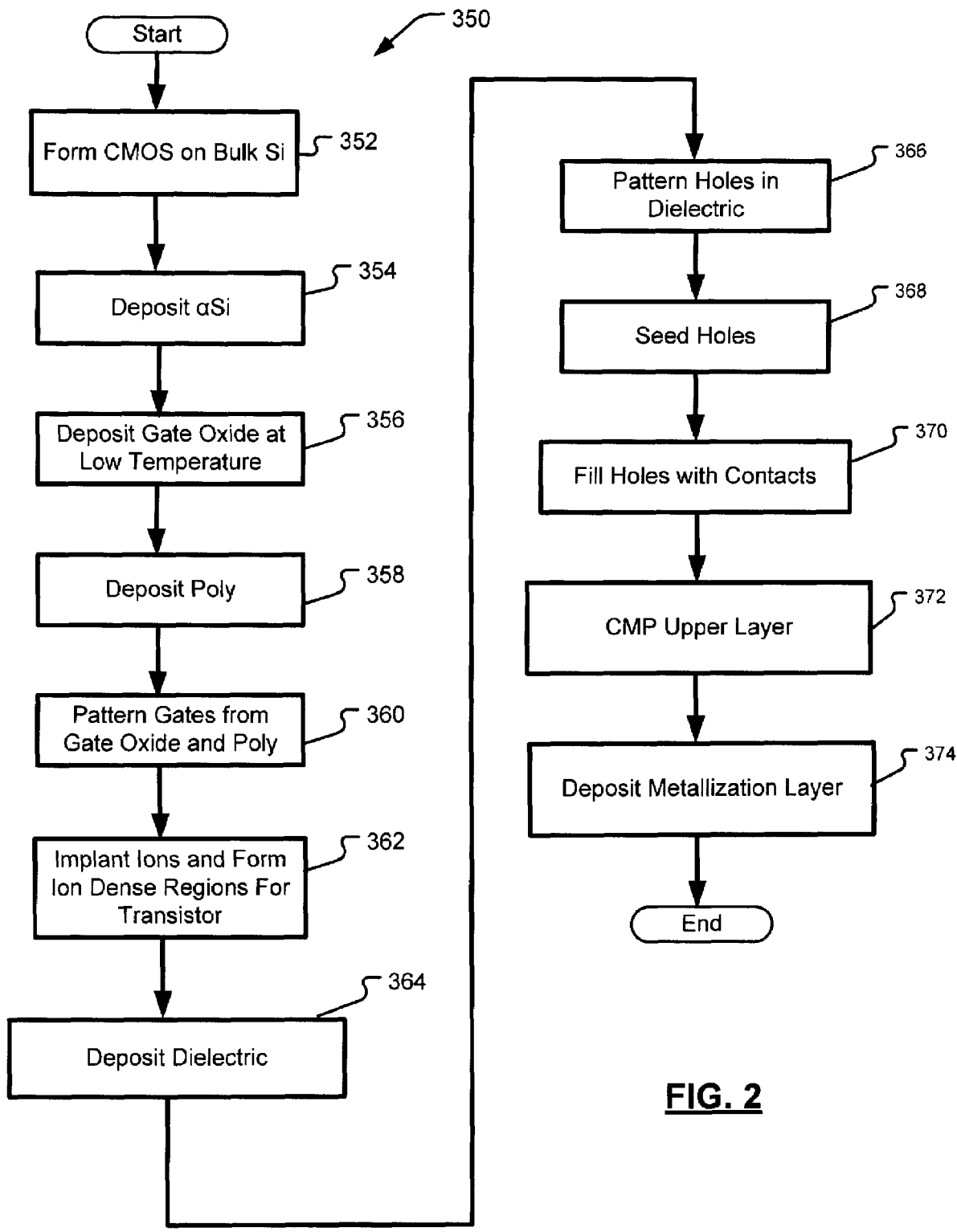
FIG. 2 illustrates a method for fabricating a 1T DRAM on bulk silicon technology in accordance with the present disclosure.

Referring now to FIG. 2, a method 350 for fabricating 1T-DRAMs on bulk silicon technology is illustrated. In step 352, a CMOS or other semiconductor component is formed on bulk silicon and insulated by a first ILD. Contacts are included within the first ILD for controlling operations of the CMOS.

In step 354, a thin layer of αSi is deposited over the first ILD. In step 356, a gate oxide is deposited over the αSi at a low temperature to maintain amorphous properties of the αSi. In step 358, polysilicon is deposited over the gate oxide. In step 360, gates for 1T DRAM transistors are patterned from the gate oxide and polysilicon.

In step 362, ions are implanted in the oxide and αSi, forming ion dense regions for the thin film transistor. These regions may be electron or hole dense depending on the type of transistor. In step 364, a dielectric is deposited above the gates and the ion dense regions. In step 366, holes are opened or patterned in the dielectric deposited in step 364. In step 368, through the holes of step 366, a seeding metal seeds an upper area of the first level of contacts and a portion of the αSi between the gates. This seeding process creates crystal silicon islands.

In step 370, contacts fill a remainder of space within the holes of step 366. In step 372, chemical mechanical polishing is performed on an upper layer of the dielectric and contacts of steps 364 and 370. In step 374, a metallization layer is deposited above the dielectric and contacts of steps 364 and 370. The metallization layer may then be patterned, and steps 354-372 may be repeated to create high capacity memory devices.

Figure 3E:
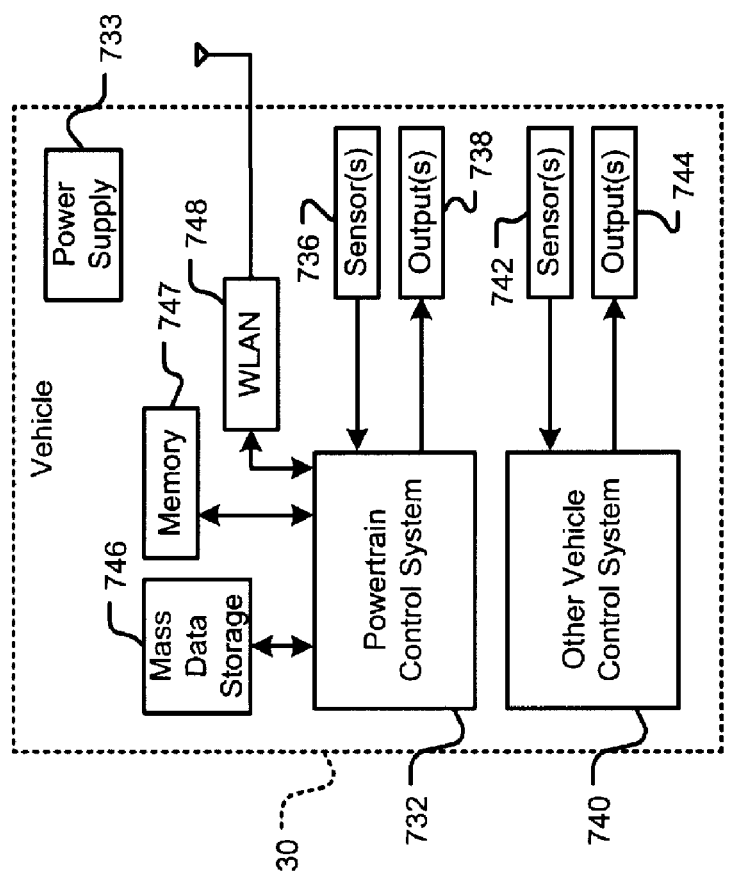
FIG. 3E is a functional block diagram of a vehicle control system.

Referring now to FIGS. 3A-3H, various exemplary implementations of the 1T-DRAM on bulk silicon are shown. Referring now to FIG. 3A, the 1T-DRAM on bulk silicon can be implemented in memory 404 of a laptop computer system 400. The computer system 400 includes a processor 402 coupled through a bus 401 to memory 404 including a 1T-DRAM on bulk silicon array 405 controlled by a module controller 416. The computer system 400 includes a mass storage device 406. A keyboard controller 410 is connected to the bus 401 for receiving commands or data entered through a keyboard, mouse, or similar input device. A display device controller 412 is also connected to the bus 401 for providing output through an appropriately connected display device 414. Also connected to the bus 401 is an input/output controller 408 for interfacing the processor 402 with other devices, such as network interface devices and the like.

The computer system 400 may communicate with a host device (not shown) including mobile computing devices such as personal digital assistants (PDA), cellular phones, media or MP3 players and the like, and/or other devices via one or more wired or wireless communication links.

Referring now to FIG. 3B, the 1T-DRAM on bulk silicon can be implemented in memory 429 of a hard disk drive 420. Memory 429 operates in conjunction with either or both signal processing and/or control circuits, which are generally identified in FIG. 3B at 422, and/or a power supply 423. In some implementations, the signal processing and/or control circuit 422 and/or other circuits (not shown) in the HDD 420 may process data, perform coding and/or encryption, perform calculations, and/or format data that is output to and/or received from a magnetic storage medium 426.

The HDD 420 may communicate with a host device (not shown) such as a computer, mobile computing devices such as personal digital assistants, cellular phones, media or MP3 players and the like, and/or other devices via one or more wired or wireless communication links 428.

Referring now to FIG. 3C, a 1T-DRAM on bulk silicon can be implemented in memory 519 of a digital versatile disc (DVD) drive 510. Memory 519 operates in conjunction with either or both signal processing and/or control circuits, which are generally identified in FIG. 3C at 512, mass data storage 518 of the DVD drive 510 and/or a power supply 513. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and other circuits (not shown) in the DVD 510 can also perform other functions such as encoding and/or decoding and/or any other signal processing functions associated with a DVD drive.

Figure 3D:
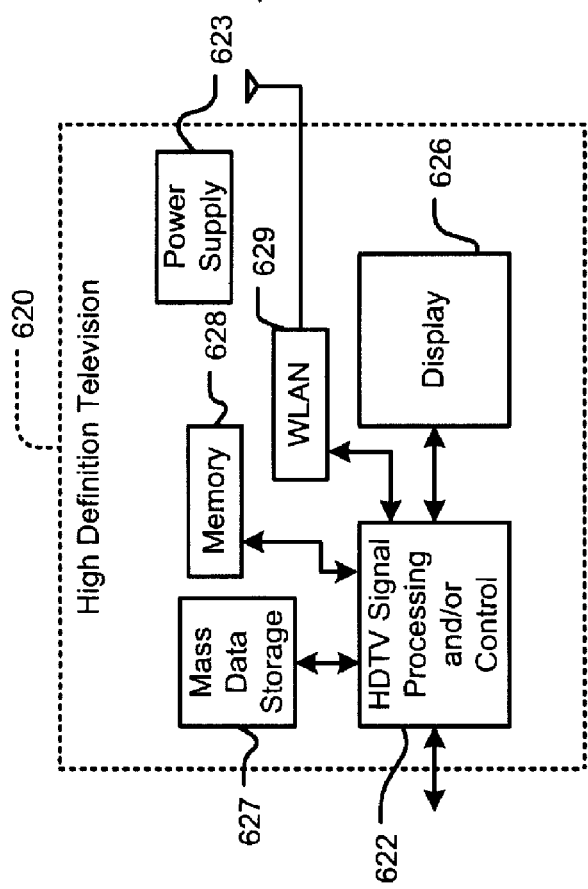
FIG. 3D is a functional block diagram of a high definition television.

Referring now to FIG. 3D, a 1T-DRAM on bulk silicon can be implemented as memory 628 for a high definition television (HDTV) 620. Memory 628 may implement and/or be implemented with either or both signal processing and/or control circuits, which are generally identified in FIG. 3D at 622, a WLAN interface, mass data storage of the HDTV 620 and/or a power supply 623. The HDTV 620 receives HDTV input signals in either a wired or wireless format and generates HDTV output signals for a display 626. In some implementations, signal processing circuit and/or control circuit 622 and/or other circuits (not shown) of the HDTV 620 may process data, perform coding and/or encryption, perform calculations, format data and/or perform any other type of HDTV processing that may be required.

The HDTV 620 may communicate with mass data storage 627. The HDD may be a mini HDD that includes one or more platters having a diameter that is smaller than approximately 1.8". The HDTV 620 may be connected to memory 628. The HDTV 620 also may support connections with a WLAN via a WLAN network interface 629.

Referring now to FIG. 3E, a 1T-DRAM on bulk silicon may implement and/or be implemented in memory 747 of a vehicle control system 730. Memory 747 functions with a powertrain control system 732 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The 1T-DRAM on bulk silicon may also be implemented in other vehicle control systems 740. The control systems 740 may receive signals from input sensors 742 and/or output control signals to one or more output devices 744. In some implementations, the control systems 740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 732 may communicate with mass data storage 746. The powertrain control system 732 may be connected to memory 747. The powertrain control system 732 also may support connections with a WLAN via a WLAN network interface 748. The control system 740 may also include mass data storage, memory and/or a WLAN interface (all not shown).

Figure 3F:
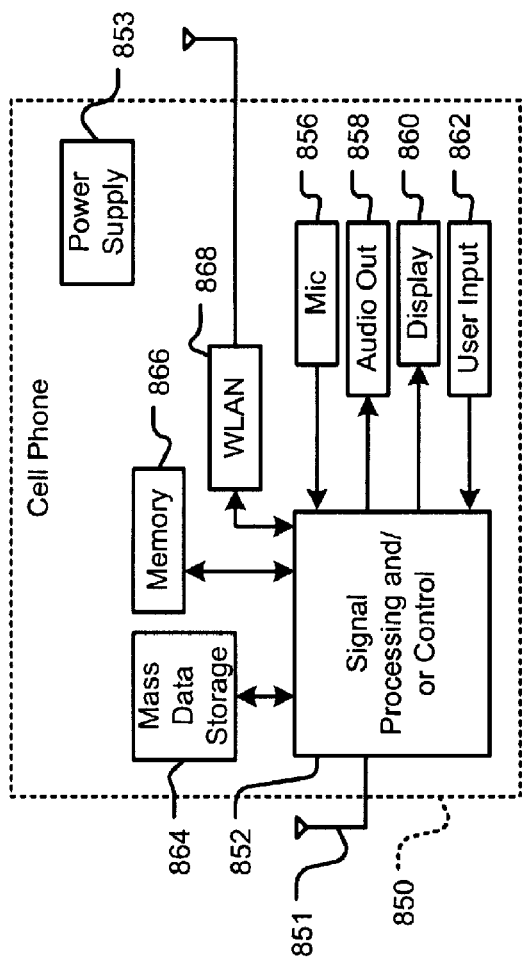
FIG. 3F is a functional block diagram of a cellular phone.

Referring now to FIG. 3F, the 1T-DRAM on bulk silicon can be implemented as memory 866 of a cellular phone 850 that may include a cellular antenna 851. Memory 866 may function with either or both signal processing and control circuits, which are generally identified in FIG. 3F at 852, a WLAN interface, mass data storage 864 of the cellular phone 850 and/or a power supply 853. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, perform coding and/or encryption, perform calculations, format data and/or perform other cellular phone functions.

The cellular phone 850 may communicate with mass data storage 864. The cellular phone 850 also may support connections with a WLAN via a WLAN network interface 868.

Figure 3G:
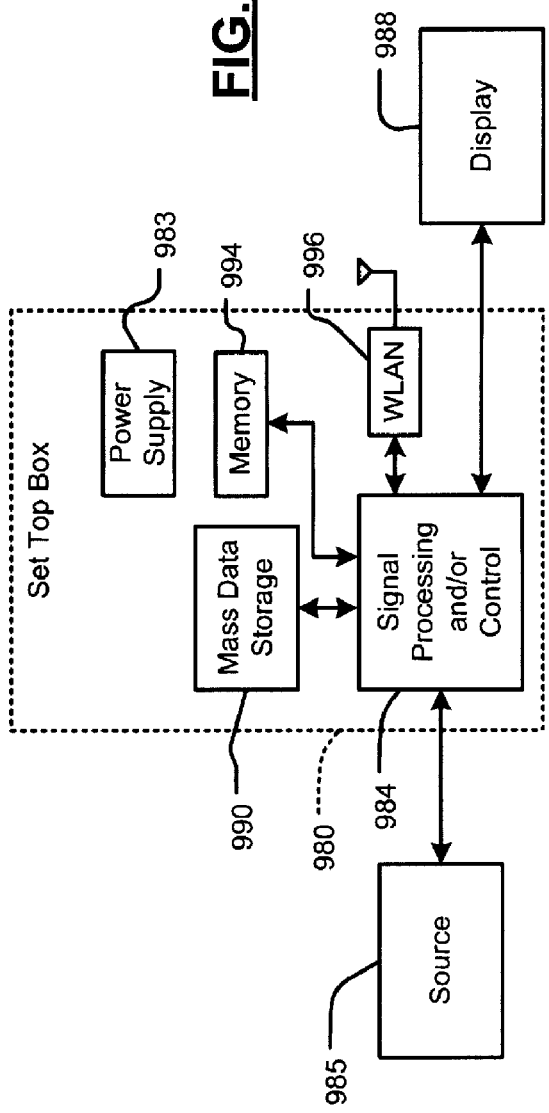
FIG. 3G is a functional block diagram of a set top box.

Referring now to FIG. 3G, the 1T-DRAM on bulk silicon can be implemented as memory 994 of a set top box 980. Memory 994 may function with either or both signal processing and/or control circuits, which are generally identified in FIG. 3G at 984, a WLAN interface, mass data storage of the set top box 980 and/or a power supply 983. The set top box 980 receives signals from a source 985 such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The set top box 980 also may support connections with a WLAN via a WLAN network interface 996.

Figure 3H:
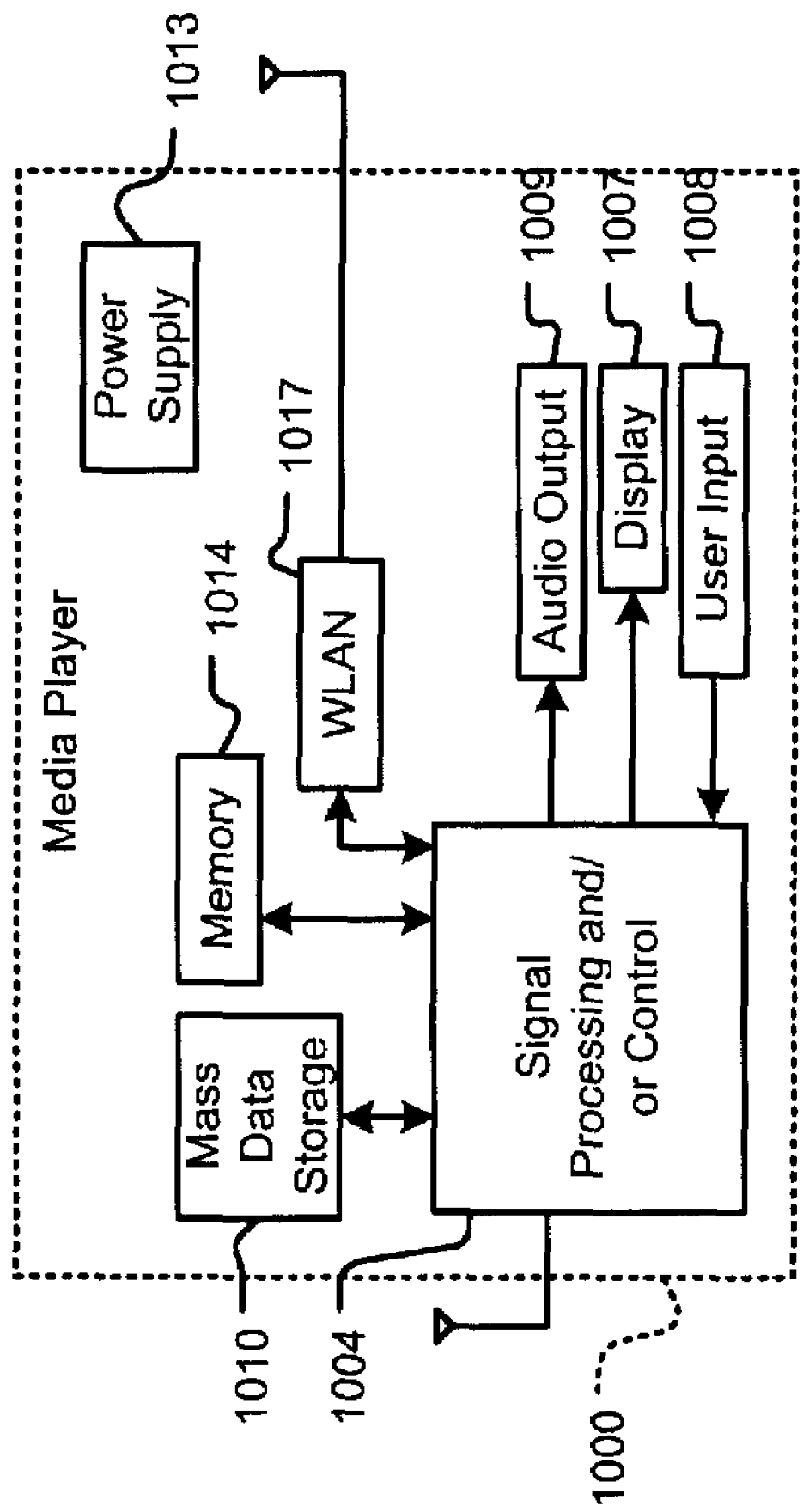
FIG. 3H is a functional block diagram of a media player.

Referring now to FIG. 3H, the 1T-DRAM on bulk silicon can be implemented as memory 1014 of a media player 1000. Memory 1014 may function with either or both signal processing and/or control circuits, which are generally identified in FIG. 3H at 1004, a WLAN interface 1017, mass data storage 1010 of the media player 1000 and/or a power supply 1013. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface with the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The media player 1000 also may support connections with a WLAN via a WLAN network interface 1017. Still other implementations in addition to those described above are contemplated.

Those skilled in the art can now appreciate from the foregoing description that the broad teachings of the disclosure can be implemented as a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A method for fabricating a one transistor dynamic random access memory cell on bulk silicon, the method comprising:

forming an integrated circuit in the bulk silicon, wherein the integrated circuit includes a first contact and a second contact;

depositing a first inter-layer dielectric over an upper surface of the integrated circuit;

depositing a layer of amorphous silicon on the first inter-layer dielectric;

removing portions of the amorphous silicon deposited on the first inter-layer dielectric over each of the first contact and the second contact such that a remainder portion of the amorphous silicon remains on the first inter-layer dielectric in between the first contact and the second contact;

depositing a gate oxide on the remainder portion of the amorphous silicon;

depositing a polysilicon layer on the gate oxide;

patterning the gate oxide and the polysilicon layer to form (i) a first gate and (ii) a second gate, wherein the first gate is laterally adjacent to the second gate;

implanting ions into the amorphous silicon at locations adjacent to each of the first gate and the second gate, wherein the ions implanted in between the first gate and the second gate form a source region that is shared by the first gate and the second gate, and wherein the ions not implanted in between the first gate and the second gate respectively form a first drain region and second drain region for the first gate and the second gate;

depositing a second inter-layer dielectric over each of (i) the first gate, (ii) the second gate, (iii) the first drain region of the first gate, (iv) the second drain region of the second gate, (v) the source region shared by the first gate and the second gate, (vi) the first contact of the integrated circuit, and (vii) the second contact of the integrated circuit;

removing portions of the second inter-layer dielectric deposited over each of the first contact of the integrated circuit, the second contact of the integrated circuit, and the source region shared by the first gate and the second gate;

forming a third contact, a fourth contact, and a fifth contact within the second inter-layer dielectric respectively over each of the first contact of the integrated circuit, the second contact of the integrated circuit, and the source region shared by the first gate and the second gate; and depositing a metal bit line over the third contact, the fourth contact, the fifth contact, and the second inter-layer dielectric.

2. The method of claim 1, wherein forming the integrated circuit in the bulk silicon comprises forming complementary metal-oxide semiconductor transistors in the bulk silicon.

3. The method of claim 1, wherein depositing the gate oxide on the remainder portion of the amorphous silicon comprises depositing the gate oxide at a low temperature to maintain an amorphous state of the amorphous silicon.

4. The method of claim 1, wherein implanting ions into the amorphous silicon comprises implanting n+ ions into the amorphous silicon.

5. The method of claim 1, wherein implanting ions into the amorphous silicon comprises implanting p+ ions into the amorphous silicon.

6. The method of claim 1, further comprising smoothing a top surface of each of the third contact, the fourth contact, the fifth contact, and the second inter-layer dielectric prior to depositing the metal bit line over the third contact, the fourth contact, the fifth contact, and the second inter-layer dielectric.

7. The method of claim 1, further comprising subsequent to removing the portions of the second inter-layer dielectric deposited over each of the first contact of the integrated circuit, the second contact of the integrated circuit, and the source region shared by the first gate and the second gate:

depositing seed materials over each of the first contact of the integrated circuit, the second contact of the integrated circuit, and the source region shared by the first gate and the second gate to form a crystalline layer over each of the first contact of the integrated circuit, the second contact of the integrated circuit, and the source region shared by the first gate and the second gate.

8. The method of claim 7, wherein the seed materials comprise nickel (Ni).

9. The method of claim 7, wherein the crystalline layer over each of the first contact of the integrated circuit, the second contact of the integrated circuit, and the source region shared by the first gate and the second gate has a same crystalline orientation as that of the amorphous silicon.

10. The method of claim 1, wherein:

forming the integrated circuit in the bulk silicon comprises forming a p-channel field effect transistor (FET) including (i) a control terminal, (ii) a first terminal, and (iii) a second terminal;

forming the integrated circuit in the bulk silicon comprises forming an n-channel FET including (i) a control terminal, (ii) a first terminal, and (iii) a second terminal;

the first contact is formed on the first terminal of the p-channel FET; and the second contact is formed on the first terminal of the n-channel FET.

11. The method of claim 10, wherein:

the second terminal of the p-channel FET is located between the first terminal of the p-channel FET and the second terminal of the n-channel FET; and the second terminal of the n-channel FET is located between the first terminal of the n-channel FET and the second terminal of the p-channel FET.

\* \* \* \* \*